(12) United States Patent
Maki et al.

(10) Patent No.: US 8,710,934 B2
(45) Date of Patent: Apr. 29, 2014

(54) ATOMIC OSCILLATOR AND MANUFACTURING METHOD

(75) Inventors: Yoshiyuki Maki, Hino (JP); Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 164 days.

(21) Appl. No.: 12/956,193

(22) Filed: Nov. 30, 2010

(65) Prior Publication Data
US 2011/0128082 A1 Jun. 2, 2011

(30) Foreign Application Priority Data

Dec. 1, 2009 (JP) ................................. 2009-273157

(51) Int. Cl.
*G04F 5/14* (2006.01)
*H01S 1/06* (2006.01)
*H03L 7/26* (2006.01)

(52) U.S. Cl.
USPC ............................................ 331/94.1; 331/3

(58) Field of Classification Search
USPC .................................... 331/94.1, 3
See application file for complete search history.

(56) References Cited

U.S. PATENT DOCUMENTS

| 6,900,702 B2 | 5/2005 | Youngner et al. |
| 2002/0163394 A1* | 11/2002 | Hollberg et al. ............. 331/94.1 |
| 2005/0184815 A1 | 8/2005 | Lipp et al. |

OTHER PUBLICATIONS

Lutwak et al., "The Chip-Scale Atomic Clock—Prototype Evaluation", 39th Annual Precise Time and Time Interval (PTTI) Meeting, Nov. 26-29, 2007.*
Liew et al., "Microfabricated Alkali Atom Vapor Cells", Appl. Phys. Lett. 84, 2694 (2004).*
Riley, "Introduction to Flip Chip", Oct. 2000, http://flipchips.com/tutorial/introduction-to-flip-chip, (also retrieved on Mar. 2001 via web.archive.org/web/20010304193524/http://www.flipchips.com/tutorial01.html).*

* cited by examiner

*Primary Examiner* — Ryan Johnson
(74) *Attorney, Agent, or Firm* — Harness, Dickey & Pierce, P.L.C.

(57) ABSTRACT

An atomic oscillator includes: a light-receiving element including a light-receiving section; a cell layer that is laminated on the light-receiving element and includes a cavity having an opening above the light-receiving section; gaseous alkali metal atoms sealed in the cavity; a transparent member to close the opening; and a light-emitting element to emit resonance light to the light-receiving section through the transparent member and the alkali metal atoms.

2 Claims, 5 Drawing Sheets

ATOMIC OSCILLATOR AND MANUFACTURING METHOD

BACKGROUND

1. Technical Field

The present invention relates to an atomic oscillator and a manufacturing method, and more particularly to an atomic oscillator in which a light-emitting element, a gas cell and a light-receiving element are vertically stacked, and a manufacturing method of the same.

2. Related Art

In recent years, as the development of a digital network, such as a communication network or a broadcast network, proceeds, a highly accurate and highly stable oscillator is indispensable as a clock source used for generation of a clock signal of a transmission apparatus or a reference frequency of a broadcast station. As such an oscillator, a rubidium atomic oscillator having a highly accurate and stable oscillation frequency is often used. Besides, in recent years, a request for miniaturization of an atomic oscillator is increased, and the necessity to miniaturize the overall size including a gas cell is compelled. At the same time, a manufacturing method in which the manufacturing cost can be reduced is requested in order to reduce the unit cost.

U.S. Pat. No. 6,900,702 B2 (Patent Document 1) discloses a structure of an atomic oscillator in which light emitted from a light source is refracted by a prism and passes through a gas cell, and is further refracted by a prism and is received by a light-receiving element.

In the related-art atomic oscillator, as one means for improving the production efficiency, a manufacturing method is adopted in which plural gas cells are integrally formed, and are later diced into single chips. However, the structure is such that the light-emitting element, the gas cell, and the light-receiving element are laterally arranged on the substrate and a certain interval is ensured between the respective members, and further, the plural mirrors to refract the light are required. Thus, it can not be necessarily said that the miniaturization is realized in the whole unit.

Besides, since the related art disclosed in Patent Document 1 uses the expensive parts such as the prism, there is a problem that the unit cost is high.

SUMMARY

An advantage of some aspects of the invention is to provide an atomic oscillator in which at least a light-receiving element or a light-emitting element and a gas cell are formed on a semiconductor substrate, and other parts are laminated thereon, so that miniaturization and cost down can be realized.

The invention can be realized as following embodiments or application examples.

Application Example 1

According to this application example of the invention, there is provided an atomic oscillator including a light-receiving element including a light-receiving section, a cell layer that is laminated on the light-receiving element and includes a cavity having an opening above the light-receiving section, gaseous alkali metal atoms sealed in the cavity, a transparent member to close the opening, and a light-emitting element to emit resonance light to the light-receiving section through the transparent member and the alkali metal atoms.

In this application example of the invention, first, the light-receiving element is formed on a semiconductor substrate. Further, the cell layer is laminated thereon, and the cavity having the opening on the opposite surface to the light-receiving element is formed by etching. The cell layer is placed in an alkali metal atom atmosphere, so that the cavity is filled with the alkali metal atoms. In this state, the opening is closed by the transparent member, and the light-emitting element is connected by a bump. By this, the monolithic atomic oscillator can be easily constructed.

Application Example 2

According to this application example of the invention, there is provided an atomic oscillator including a light-emitting element including a light-emitting section to emit resonance light, a cell layer that is laminated on the light-emitting element and includes a cavity having an opening above the light-emitting section, gaseous alkali metal atoms sealed in the cavity, a transparent member to close the opening, and a light-receiving element to receive the resonance light through the alkali metal atoms and the transparent member.

In the structure of this application example of the invention, the arrangement of the light-emitting element and the light-receiving element of the Application Example 1 is reversed. That is, the light-emitting element is formed on a semiconductor substrate. Further, the cell layer is laminated thereon, and the cavity having the opening on the opposite surface to the light-emitting element is formed by etching. This step can be realized by one step of a semiconductor process. The cell layer is placed in an alkali metal atom atmosphere, so that the cavity is filled with the alkali metal atoms. In that state, the opening is closed by the transparent member, and the light-receiving element is connected by a bump. By this, the monolithic atomic oscillator can be easily constructed.

Application Example 3

According to this application example of the invention, there is provided an atomic oscillator including a light-receiving element including a light-receiving section, a transparent member that is connected onto the light-receiving element and includes a cavity above the light-receiving section, gaseous alkali metal atoms sealed in the cavity, and a light-emitting element to emit resonance light to the alkali metal atoms through the transparent member.

In this application example of the invention, the step of closing the opening by the transparent member is omitted. That is, the light-emitting element is formed on a semiconductor substrate. The transparent member including the cavity is connected to the light-receiving element in an alkali metal atom atmosphere, so that the cavity is filled with the alkali metal atoms. The light-receiving element is connected by a bump. By this, the monolithic atomic oscillator can be easily constructed.

Application Example 4

According to this application example of the invention, there is provided a manufacturing method of an atomic oscillator including forming a light-receiving element, which includes a light-receiving section, on a semiconductor substrate, laminating an oxide film on the light-receiving element, laminating a cell layer on the oxide film, forming a cavity in the cell layer to have an opening above the light-receiving section, sealing gaseous alkali metal atoms in the cavity, closing the opening by a transparent member, and connecting a light-emitting element, which emits resonance light to the alkali metal atoms, onto the opening.

The same operation and effect as those of Application Example 1 are obtained.

Application Example 5

According to this application example of the invention, there is provided a manufacturing method of an atomic oscillator including forming a light-receiving element, which includes a light-receiving section, on a semiconductor substrate, laminating an oxide film on the light-receiving element, depositing alkali metal atoms on the oxide film, forming a transparent member including a cavity above the light-receiving section, connecting the transparent member to the light-receiving element, and connecting the light-emitting element, which emits resonance light to the alkali metal atoms, onto the transparent member.

The same operation and effect as those of Application Example 3 are obtained.

BRIEF DESCRIPTION OF THE DRAWINGS

The invention will be described with reference to the accompanying drawing, wherein like numbers reference like elements.

DESCRIPTION OF EXEMPLARY EMBODIMENTS

Hereinafter, embodiments of the invention will be described in detail with reference to the drawings. However, components, kinds, combinations, shapes, relative arrangement thereof and the like disclosed in the embodiments are not intended to limit the scope of the invention but are illustrative only.

Figure 1:
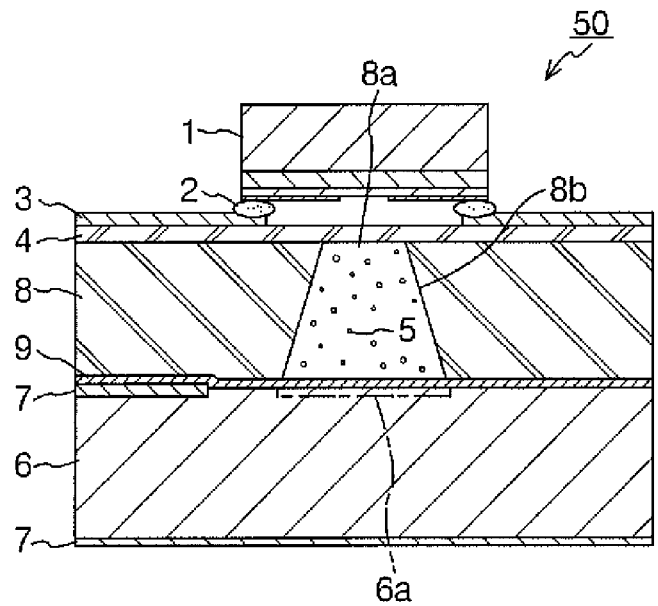
FIG. 1 is a sectional view showing a structure of an atomic oscillator of a first embodiment of the invention.

FIG. 1 is a sectional view showing a structure of an atomic oscillator of a first embodiment of the invention. This atomic oscillator 50 includes a light-receiving element (PD: Photodiode) 6 that is formed on a semiconductor substrate and includes a light-receiving section 6a, a cell layer 8 that is laminated on the light-receiving element 6 and includes a cavity 8b having an opening 8a above the light-receiving section 6a, gaseous alkali metal atoms 5 sealed in the cavity 8b, a cover glass (transparent member) 4 to close the opening 8a, and a light-emitting element (VCSEL: Vertical Cavity Surface Emitting Laser) 1 to emit resonance light to the alkali metal atoms 5 through the cover glass 4. The light-receiving element (PD) 6 is provided with an electrode 7, and an electrode 3 for the light-emitting element 1 is formed on the cover glass 4. The light-emitting element is connected to the electrode 3 through a bump 2 of the light-emitting element 1.

That is, in the embodiment of the invention, the light-receiving element 6 including the light-receiving section 6a is first formed on the semiconductor substrate. Further, the cell layer 8 is laminated thereon, and the cavity 8b having the opening 8a above the light-receiving section 6a is formed by etching. This structural body in the state where the cell layer 8 is mounted is placed in an alkali metal atom atmosphere, so that the cavity 8b is filled with the alkali metal atoms 5. In that state, the opening 8a is closed by the cover glass 4, and a cap having a recess is formed of the cover glass 4 and the cell layer 8.

The light-emitting element 1 is connected to the electrode 3 on the upper surface of the cover glass 4 by the bump 2.

Incidentally, in order to efficiently form plural atomic oscillators, it is desirable to adopt a batch processing process.

That is, after the cell layer 8 in a wafer state is overlapped on the semiconductor substrate in a wafer state in which plural light-receiving sections 6a are formed, plural cavities 8b are formed at desired positions. Thereafter, in order to close openings 8a in the state where alkali metal atoms are filled in the cavities 8b, a structural body is prepared in which the cover glass 4 in a wafer state is overlapped on the cell layer 8 in a wafer state and is connected thereto.

At a stage before the light-emitting elements 1 are mounted on the structural body or after the light-emitting elements 1 are mounted thereon, the structural body is cut and solidified for every atomic oscillator or every part for the atomic oscillator in the state before the light-emitting elements 1 are mounted. By this, the monolithic atomic oscillator can be easily constructed.

Incidentally, the cell layer 8 in which the cavity 8b is formed may be prepared before it is mounted on the semiconductor substrate 6.

Figure 2:
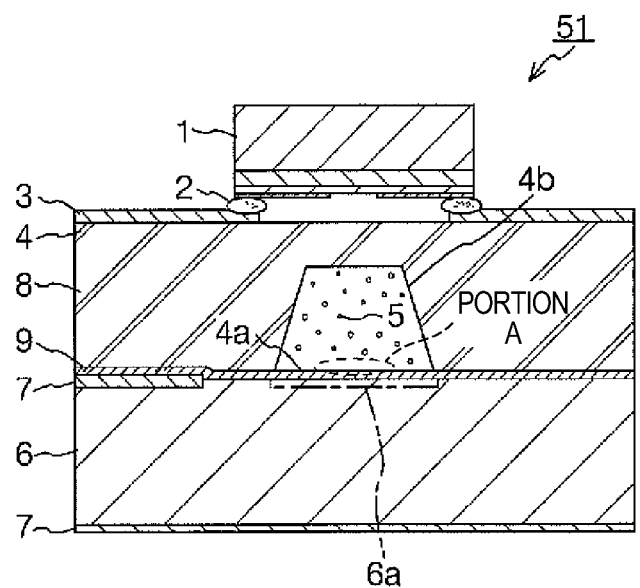
FIG. 2 is a sectional view showing a structure of an atomic oscillator of a second embodiment of the invention.

FIG. 2 is a sectional view showing a structure of an atomic oscillator of a second embodiment of the invention. This atomic oscillator 51 includes a light-receiving element 6 (PD) that is formed on a semiconductor substrate and includes a light-receiving section 6a, a cover glass (transparent member) 4 that is connected onto the light-receiving element 6 and includes a cavity 4b above the light-receiving section 6a, gaseous alkali metal atoms 5 sealed in the cavity 4b, and a light-emitting element (VCSEL) 1 to emit resonance light to the alkali metal atoms 5 through the cover glass 4. The light-receiving element (PD) 6 is provided with an electrode 7, and an electrode 3 for the light-emitting element 1 is formed on the cover glass 4. The light-emitting element is connected to the electrode 3 through a bump 2 of the light-emitting element 1. Here, a difference between FIG. 1 and FIG. 2 is that in FIG. 1, after the cell layer 8 is mounted on the semiconductor substrate, the cavity 8b is formed, and the alkali metal atoms 5 in the cavity 8b are sealed by the plate-like cover glass 4, while in FIG. 2, the light-receiving element 6 and a cap are previously separately formed, and both are connected while the alkali metal atoms 5 are sealed in the cavity 4b (a manufacturing method will be described later).

That is, in this embodiment, a step of closing the opening by the cover glass can be omitted. That is, the light-receiving element 6 including the light-receiving section 6a is formed on the semiconductor substrate. The cap is prepared in which the cavity 4b is formed in, for example, glass as transparent material. Thereafter, the cap and the light-receiving element 6 are overlapped with and connected to each other in an alkali metal atom atmosphere while the light-receiving section 6a is located in the opening of the cavity 4b, so that the cavity 4b is filled with the alkali metal atoms 5. The light-emitting element 1 is connected by the bump 2. By this, the monolithic atomic oscillator can be easily constructed without fear of damaging the light-receiving section 6a by a chemical process such as etching.

Incidentally, also in the case of the monolithic atomic oscillator shown in FIG. 1, the light-receiving element 6 and the cap are separately prepared, and both may be connected to each other in the alkali metal atom atmosphere.

Figure 3:
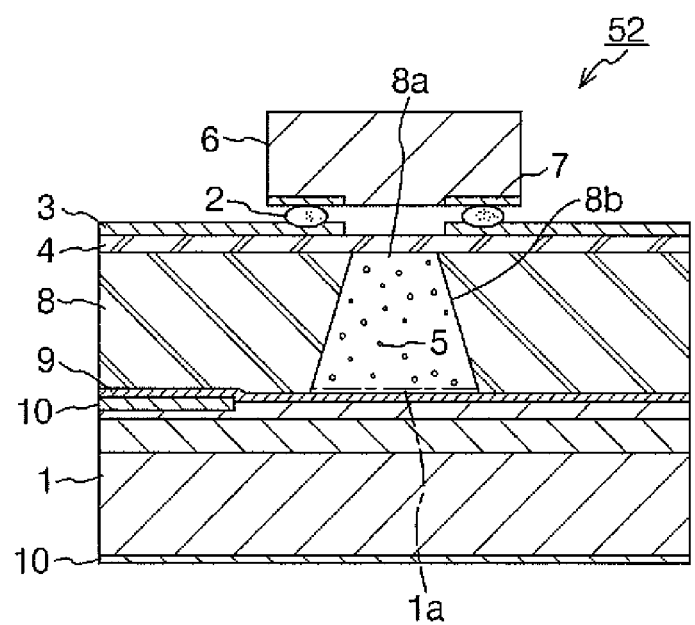
FIG. 3 is a sectional view showing a structure of an atomic oscillator of a third embodiment of the invention.

FIG. 3 is a sectional view showing a structure of an atomic oscillator of a third embodiment of the invention. This atomic oscillator 52 includes a light-emitting element (VCSEL) 1 that is formed on a semiconductor substrate and includes a light-emitting section 1a, a cell layer 8 that is laminated on the light-emitting element 1 and includes a cavity 8b having an opening 8a above the light-emitting section 1a, gaseous alkali metal atoms 5 sealed in the cavity 8b, a cover glass (transparent member) 4 to close the opening 8a, and a light-receiving element (PD) 6 to receive resonance light, which passes through the alkali metal atoms 5, through the cover glass 4. Incidentally, the light-emitting element (VCSEL) 1 is provided with an electrode 10, and an electrode 3 for the light-receiving element 6 is formed on the cover glass 4. The light-receiving element is connected to the electrode 3 through a bump 2 of the light-receiving element 6. A difference between FIG. 1 and FIG. 3 is that in FIG. 1, the cavity 8b is formed in the cell layer 8 laminated on the light-receiving element 6, while in FIG. 3, the cavity 8b is formed in the cell layer 8 laminated on the light-emitting element 1.

That is, in this embodiment, the arrangement of the light-emitting element 1 and the light-receiving element 6 of FIG. 1 is reversed. That is, the light-emitting element 1 including the light-emitting section 1a is formed on the semiconductor substrate. Further, the cell layer 8 is laminated thereon, and the cavity 8b having the opening 8a above the light-emitting section 1a is formed by etching. The cell layer 8 is placed in an alkali metal atom atmosphere, so that the cavity 8b is filled with the alkali metal atoms 5. In that state, the opening 8a is closed by the cover glass 4, and the light-receiving element 6 is connected by the bump 2. By this, the monolithic atomic oscillator can be easily constructed.

Figure 4:
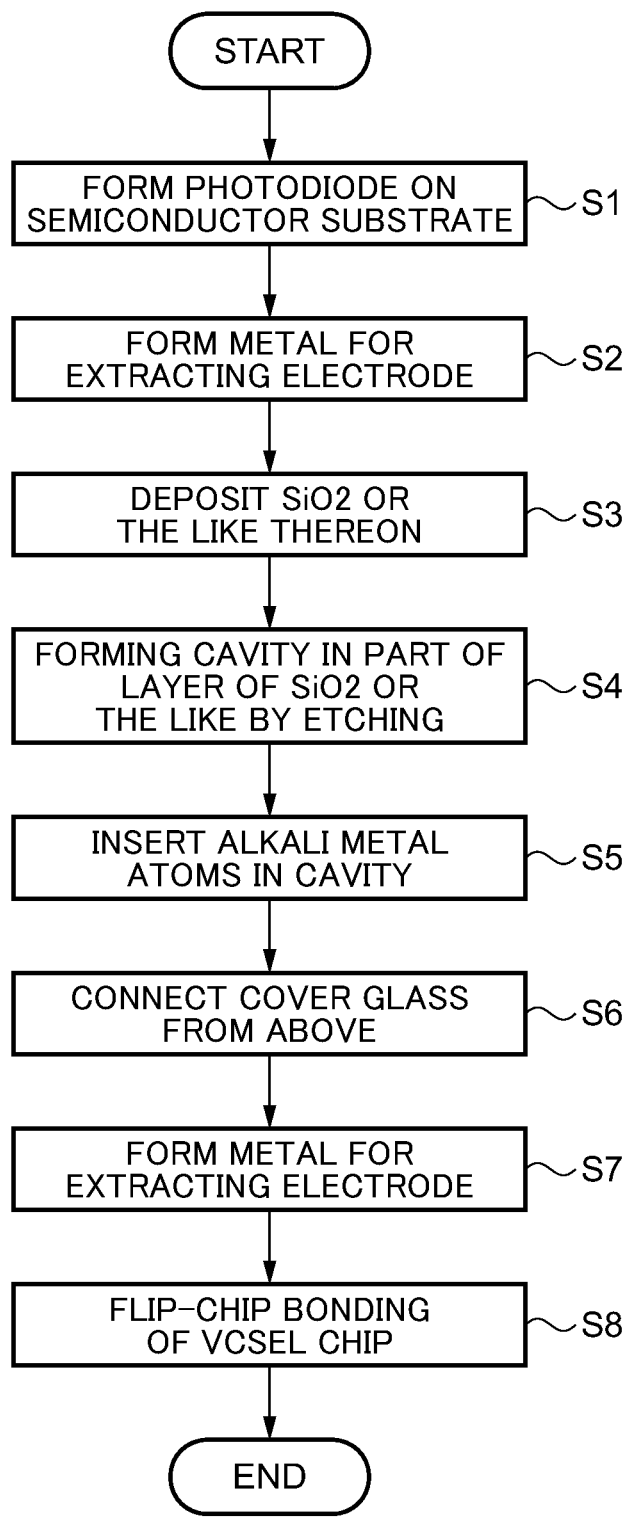
FIG. 4 is a flowchart for explaining a manufacturing process of the atomic oscillator of FIG. 1.

FIG. 4 is a flowchart for explaining a manufacturing process of the atomic oscillator of FIG. 1. First, the light-receiving element 6 is formed on the semiconductor substrate (S1), and a metal film (hereinafter simply referred to as an electrode 7) for extracting an electrode is formed (S2). Next, the cell layer is laminated on the light-receiving element 6 (S3). The cavity 8b is formed by etching a part of the cell layer (S4). At this time, the opening 8a is provided on one side of the cavity 8b. Next, the gaseous alkali metal atoms 5 are sealed in the cavity 8b (S5), and the cover glass 4 is connected to close the opening 8a (S6). The electrode is formed on the cover glass 4 (S7). Finally, the light-emitting element 1 to emit resonance light to the alkali metal atoms 5 is mounted above the opening 8a, and the electrode 3 and the bump 2 are connected (flip-chip bonding) (S8).

Figure 5:
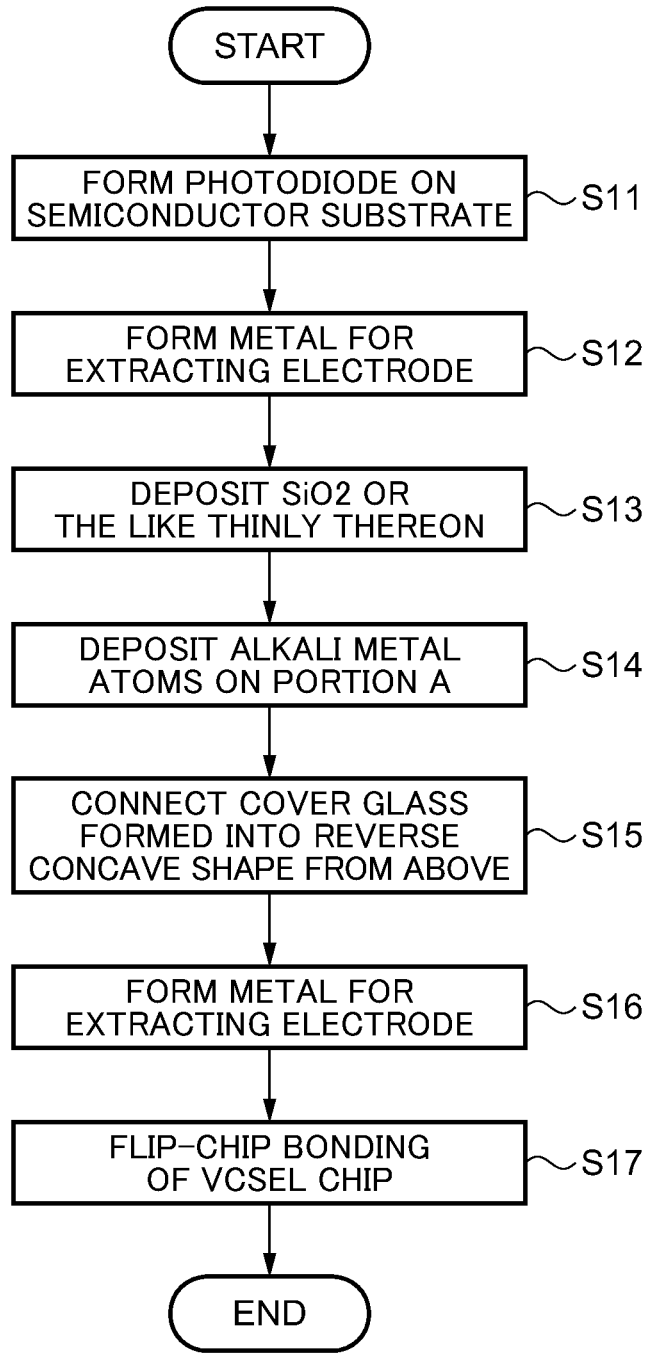
FIG. 5 is a flowchart for explaining a manufacturing process of the atomic oscillator of FIG. 2.

FIG. 5 is a flowchart for explaining a manufacturing process of the atomic oscillator of FIG. 2. First, the light-receiving element 6 is formed on the semiconductor substrate (S11), and further, the electrode 7 is formed (S12). Next, an oxide film 9 is laminated on the light-receiving element 6 (S13). Alkali metal atoms are deposited on a portion A of FIG. 2 (S14). The cap including the cavity 4b at the position opposite to the light-receiving element 6 is connected from above (S15). The electrode 3 is formed on the cap (S16). Finally, the light-emitting element 1 to emit resonance light to the alkali metal atoms 5 is mounted on the cap, and the electrode 3 and the bump 2 are connected (flip-chip bonding) (S17).

Figure 6:
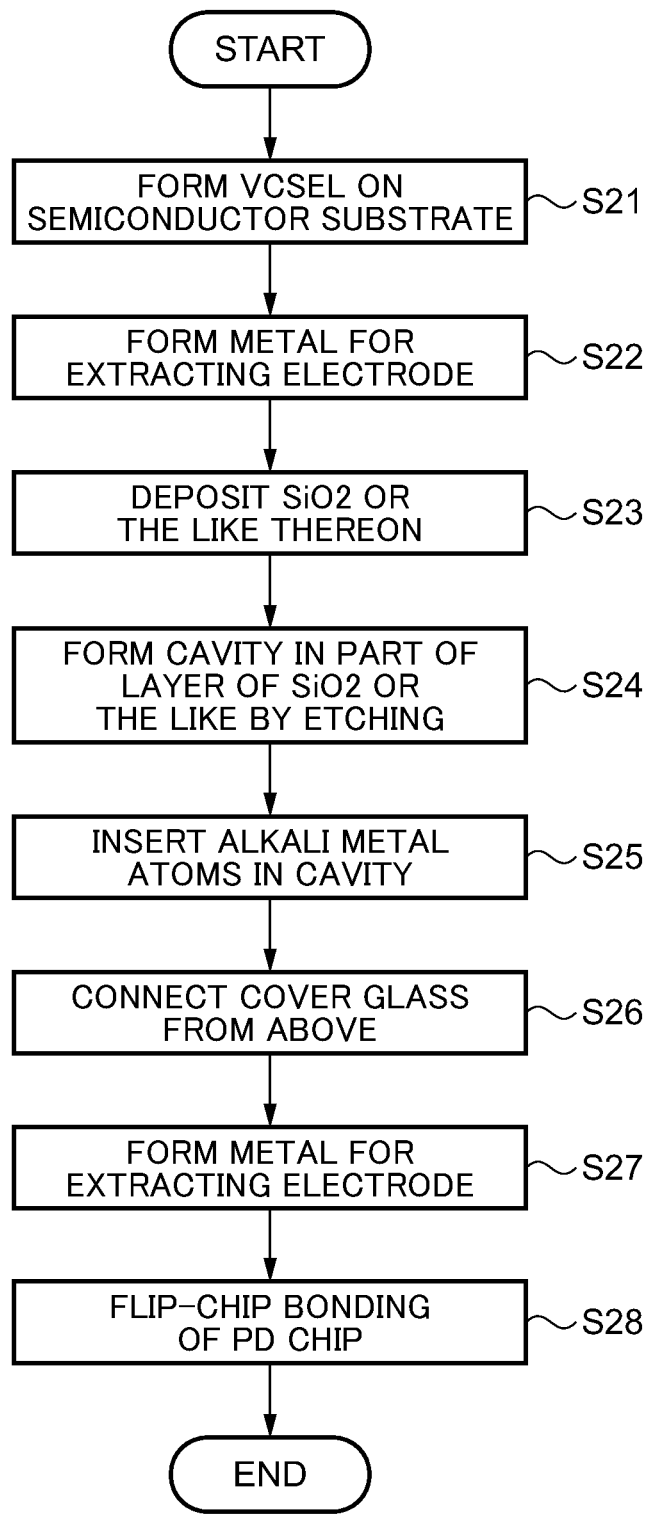
FIG. 6 is a flowchart for explaining a manufacturing process of the atomic oscillator of FIG. 3.

FIG. 6 is a flowchart for explaining a manufacturing process of the atomic oscillator of FIG. 3. First, the light-emitting element 1 is formed on the semiconductor substrate (S21), and further, the electrode 10 is formed (S22). Next, the cell layer 8 is laminated on the light-emitting element 1 (S23). The cavity 8b is formed by etching a part of the cell layer 8 (S24). Next, the gaseous alkali metal atoms 5 are sealed in the cavity 8b (S25), and the cover glass 4 is connected to close the opening 8a (S26). The electrode 3 is formed on the cover glass 4 (S27). Finally, the light-receiving element 6 to receive resonance light is mounted above the opening 8a, and the electrode 3 and the bump 2 are connected (flip-chip bonding) (S28).

The entire disclosure of Japanese Patent Application No. 2009-273157, filed Dec. 1, 2009 is expressly incorporated by reference herein.

What is claimed is:

1. An atomic oscillator comprising:
   a semiconductor element comprising a light-receiving element including a light-receiving section, the light-receiving section being coated with an oxide film;
   a cover glass that is coupled to the light-receiving element and includes a cavity formed therein above the light-receiving section, the cover glass including a first section unitary therewith that overlaps the cavity that has a thickness less than second sections on opposing sides of the cavity;
   gaseous alkali metal atoms sealed in the cavity; and
   a light-emitting element to emit resonance light to the alkali metal atoms through the first section,
   wherein an open end of the cavity exposes the gaseous metal atoms to the oxide film, and
   the oxide film is sandwiched between the cover glass and the light-receiving element.

2. The atomic oscillator of claim 1, further comprising an electrode formed on the cover glass and a bump that electrically connects the electrode to the light-emitting element.

* * * * *